(12) United States Patent
Fisher et al.

(10) Patent No.: US 6,773,998 B1
(45) Date of Patent: Aug. 10, 2004

(54) MODIFIED FILM STACK AND PATTERNING STRATEGY FOR STRESS COMPENSATION AND PREVENTION OF PATTERN DISTORTION IN AMORPHOUS CARBON GATE PATTERNING

(75) Inventors: Philip A. Fisher, Foster City, CA (US); Marina V. Plat, San Jose, CA (US); Chih-Yuh Yang, San Jose, CA (US); Christopher F. Lyons, Fremont, CA (US); Scott A. Bell, San Jose, CA (US); Douglas J. Bonser, Austin, TX (US); Lu You, San Jose, CA (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/445,129

(22) Filed: May 20, 2003

(51) Int. Cl.$^7$ .............................................. H01L 21/336

(52) U.S. Cl. ...................... 438/286; 438/488; 438/758

(58) Field of Search ................................ 438/286, 488, 438/758

(56) References Cited

U.S. PATENT DOCUMENTS

| | | | |
|---|---|---|---|
| 5,185,293 A | | 2/1993 | Franke et al. |
| 5,656,128 A | | 8/1997 | Hashimoto et al. |
| 5,721,090 A | * | 2/1998 | Okamoto et al. ........... 430/313 |
| 5,759,746 A | | 6/1998 | Azuma et al. |
| 6,030,541 A | * | 2/2000 | Adkisson et al. .............. 216/51 |
| 6,140,200 A | * | 10/2000 | Eldridge |
| 6,368,924 B1 | | 4/2002 | Mancini et al. |
| 6,388,924 B1 | | 5/2002 | Nasu |
| 6,413,852 B1 | * | 7/2002 | Grill et al. |
| 6,573,030 B1 | * | 6/2003 | Fairbairn et al. ........... 430/323 |

OTHER PUBLICATIONS

U.S. patent application No. 10/215,173, entitled "Use of Amorphous Carbon Hard Mask for Gate Patterning to Eliminate Requirement of Poly Re–Oxidation", as filed on Aug. 8, 2002, including claims, drawings, and abstract (29 pages).

U.S. patent application No. 10/277,760, entitled "Sacrificial Air Gap Layer for Insulation of Metals", as filed on Aug. 8, 2002, including claims, drawings, and abstract (17 pages).

U.S. patent application No. 10/244,650, entitled "Use of Multilayer Amorphous Carbon Arc Stack to Eliminate Line Warpage Phenomenon", as filed on Sep. 16, 2002, including claims, drawings, and abstract (30 pages).

U.S. patent application No. 10/217,730, entitled "Ion Implantation to Modulate Amorphous Carbon Stress", as filed on Aug. 13, 2002, including claims, drawings, and abstract (29 pages).

U.S. patent application No. 10/424,420, entitled "Use of Amorphous Carbon for Gate Pattering", filed Apr. 28, 2003, by Fisher et al.

(List continued on next page.)

Primary Examiner—George Fourson
Assistant Examiner—Fernando L. Toledo
(74) Attorney, Agent, or Firm—Foley & Lardner LLP

(57) ABSTRACT

A method for an integrated circuit includes the use of an amorphous carbon ARC mask. A layer of amorphous carbon material is deposited above a layer of conductive material, and a layer of anti-reflective coating (ARC) material is deposited over the layer of amorphous carbon material. The layer of amorphous carbon material and the layer of ARC material are etched to form a mask comprising an ARC material portion and an amorphous carbon portion. A feature may then be formed in the layer of conductive material by etching the layer of conductive material in accordance with the mask.

22 Claims, 6 Drawing Sheets

OTHER PUBLICATIONS

U.S. patent application No. 10/230,794, entitled "Formation of Amorphous Carbon Arc Stack Having Graded Transition Between Amorphous Carbon and Arc Material", as filed on Aug. 29, 2002, including claims, drawings, and abstract (29 pages).

U.S. patent application No. 10/230,775 entitled "Use of Buffer Dielectric Layer with Amorphous Carbon Mask to Reduce Line Warpage", as shown on Aug. 29, 2002, including claims, drawings, and abstract (28 pages).

U.S. patent application No. 10/335,726, entitled "Use of Diamond as a Hark Mask Material", as filed on Jan. 2, 2003, including claims, drawings, and abstract (25 pages).

U.S. patent application No. 10/424,675, entitled "Selective Stress–inducing Implant and Resulting Pattern Distortion in Amorphous Carbon Patterning", as filed on Apr. 28, 2003, including claims, drawings, and abstract (28 pages).

* cited by examiner

MODIFIED FILM STACK AND PATTERNING STRATEGY FOR STRESS COMPENSATION AND PREVENTION OF PATTERN DISTORTION IN AMORPHOUS CARBON GATE PATTERNING

CROSS-REFERENCE TO RELATED PATENT APPLICATIONS

This application is related to U.S. patent application Ser. No. 10/215,173 filed Aug. 8, 2002 and entitled "Use of Amorphous Carbon Hard Mask for Gate Patterning to Eliminate Requirement of Poly Re-Oxidation," U.S. patent application Ser. No. 10/277,760 filed Oct. 22, 2002 and entitled "Sacrificial Air Gap Layer for Insulation of Metals," U.S. patent application Ser. No. 10/244,650 filed Sep. 16, 2002 and entitled "Use of Multilayer Amorphous Carbon Hard Mask to Eliminate Line Warpage Phenomenon," U.S. patent application Ser. No. 10/424,420 filed Apr. 28, 2003 and entitled "Use of Amorphous Carbon for Gate Patterning," U.S. patent application Ser. No. 10/230,794 filed Aug. 29, 2002 and entitled "Formation of Amorphous Carbon ARC Stack Having Graded Transition Between Amorphous Carbon and ARC Material," U.S. patent application Ser. No. 10/335,726 filed Jan. 2, 2003 and entitled "Use of Diamond as a Hard Mask Material," U.S. patent application Ser. No. 10/424,675 filed Apr. 28, 2003 and entitled "Selective Stress-Inducing Implant and Resulting Pattern Distortion in Amorphous Carbon Gate Patterning," and U.S. patent application Ser. No. 10/217,730 filed Aug. 13, 2002 and entitled "Ion Implantation to Modulate Amorphous Carbon Stress," each of which is assigned to the assignee of the present application.

FIELD OF THE INVENTION

The present invention relates generally to the field of integrated circuits and methods of manufacturing integrated circuits. More particularly, the present invention relates to the use of masks formed of amorphous carbon to form features in integrated circuits.

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors (e.g., MOSFETs), are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

As critical dimensions (CDs) of device structures are made smaller, certain issues must be addressed during processing. One such issue involves the use of a wet etch to remove mask layers used in the formation of the structures. When structures having small critical dimensions are produced, the introduction of phosphoric acid or other aqueous etchants to remove a mask layer may damage the structure formed during the etching process.

Another issue that must be addressed is that the shape integrity of the structures formed may be lessened where the materials used to form the mask layer include an internal stress. For example, where a mask material includes an internal compressive or tensile stress by virtue of the microstructure of the material, under certain conditions the mask material may deform. The deformed mask layer will then transfer the deformed pattern into the underlying material when the mask is used during an etch or material removal step. This phenomenon is sometimes referred to as line warpage or "wiggle." For example, conductive lines formed that exhibit warpage or wiggle characteristics may appear as a serpentine or curving structure. The warpage or wiggle of the line may increase the distance that electrons must travel through the conductive line (and hence increase the resistance of the conductive line) when compared to conductive lines that do not exhibit warpage or wiggle characteristics.

Thus, there is a need to form structures in an integrated circuit using an improved method that produces structures having reduced critical dimensions. Further, there is a need to improve the shape integrity of structures formed during manufacturing (e.g., reducing or eliminating conductive line warpage, etc.). Even further, there is a need to use amorphous carbon as a mask in the formation of integrated circuit structures.

SUMMARY OF THE INVENTION

An exemplary embodiment relates to a method for producing an integrated circuit. The method includes providing an amorphous carbon layer above a layer of polysilicon material and providing a layer of anti-reflective coating (ARC) material above the amorphous carbon layer. The method also includes removing a portion of the amorphous carbon layer and the layer of ARC material to form an amorphous carbon ARC stack, patterning the layer of polysilicon material according to the amorphous carbon ARC stack, and removing the amorphous carbon ARC stack.

Another exemplary embodiment relates to a method for forming features in an integrated circuit. The method includes depositing a layer of amorphous carbon material above a layer of conductive material and depositing a layer of anti-reflective coating (ARC) material over the layer of amorphous carbon material. The method also includes etching the layer of amorphous carbon material and the layer of ARC material to form a mask. The mask comprises an ARC material portion and an amorphous carbon portion. The method further includes forming a feature in the layer of conductive material by etching the layer of conductive material in accordance with the mask.

A further exemplary embodiment relates to an integrated circuit formed by a method comprising providing a layer of polysilicon above a semiconductor substrate and providing a layer of amorphous carbon above the layer of polysilicon. The method also includes providing a cap layer over the layer of amorphous carbon. The cap layer comprises an anti-reflective coating (ARC) material. The method further includes removing a portion of the cap layer to form a cap feature, removing a portion of the amorphous carbon layer to form an amorphous carbon feature beneath the cap feature, and thinning the cap feature to form a thinned cap layer. The method further includes etching the layer of polysilicon according to the amorphous carbon feature and the thinned cap feature to form a conductive line.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
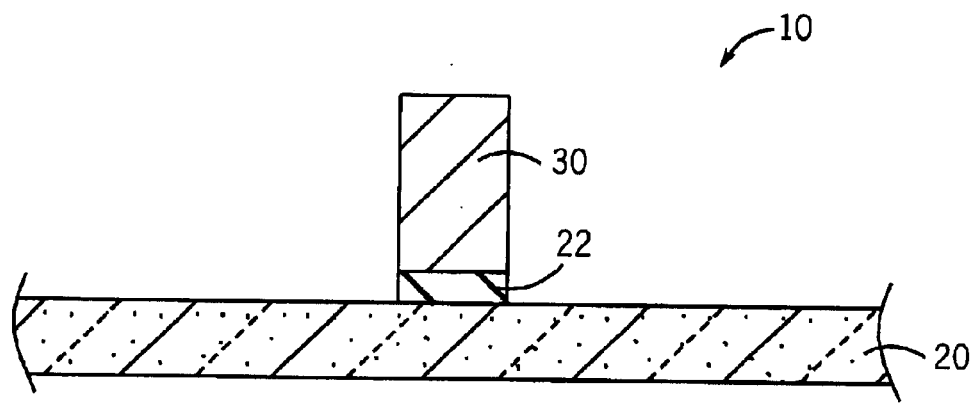
FIG. 1 is a schematic cross-sectional view of a portion of an integrated circuit fabricated in accordance with an exemplary embodiment.

Referring to FIG. 1, a portion 10 of an integrated circuit (IC) includes a substrate layer 20, an oxide or dielectric layer 22, and a line or gate conductor 30. Portion 10 is preferably part of an ultra-large-scale integrated (ULSI) circuit having a million or more transistors, and is manufactured as part of the IC on a wafer made of a semiconducting material (e.g., silicon, gallium arsenide, etc.).

Conductive line 30 can be a metal, a polysilicon, or polysilicon/germanium ($Si_xGe_{(1-x)}$) material that controls charge carriers in a channel region formed between source and drain regions in substrate 20 to turn the transistor on and off. Conductive line 30 may be doped or undoped. In an exemplary embodiment, conductive line 30 is made of a polysilicon material and has a thickness between approximately 500 and 1,000 angstroms and a width of between approximately 30 and 50 nanometers.

Figure 2A:
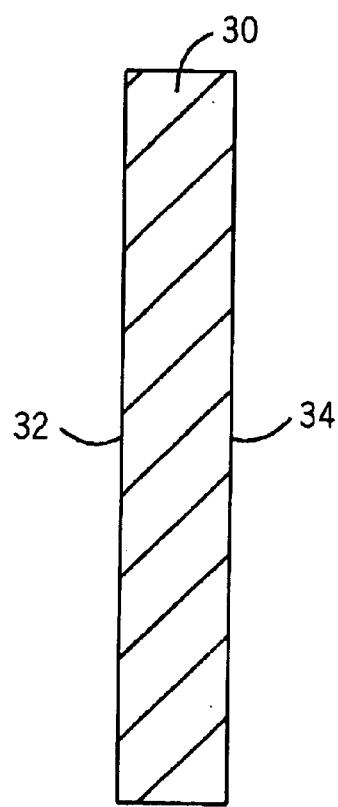
FIG. 2A is a top elevation view of the integrated circuit portion shown in FIG. 1 showing a feature formed without warpage.

As shown in the exemplary embodiment of FIG. 2A, conductive line 30 is preferably formed using a method that maintains the shape integrity of structures formed by reducing or eliminating the phenomenon of warpage or "wiggle." In an example of a conductive line formed in an integrated circuit, one result is that the tendency to form conductive lines having a generally serpentine or curved shape along their length is reduced or eliminated.

Figure 2B:
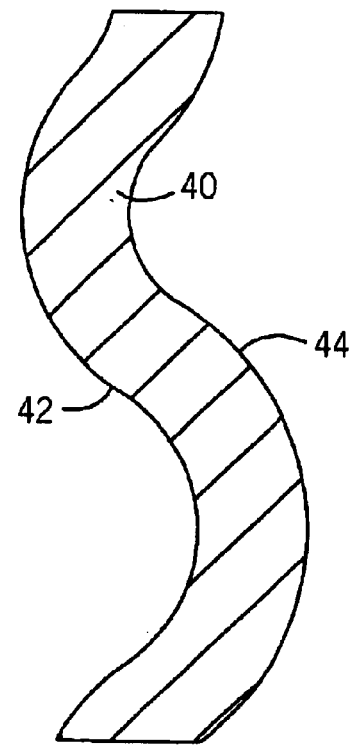
FIG. 2B is a top elevation view of a feature similar to that shown in FIG. 2A showing a warpage phenomenon.

The warpage phenomenon may be illustrated with reference to FIGS. 2A and 2B. In manufacturing integrated circuits, it is desirable to produce conductive lines that have a generally straight profile. One example of such a conductive line is shown in FIG. 2A, where the sides or lateral edges 32, 34 of conductive line 30 have a substantially straight or linear configuration along their length. In contrast to conductive line 30, FIG. 2B shows a conductive line 40 manufactured by a method that does not reduce or eliminate warpage along the length of conductive line 40. As shown, sides or edges 42, 44 are not linear, but rather include a generally curved or warped shape. The amount or magnitude of curvature may vary depending on various conditions, including the properties of the mask or patterning material used, the properties of the material being patterned or etched, and the processing conditions used during the etching operation, among others.

One material that may be used as a hard mask in the formation of integrated circuit structures having reduced critical dimensions (e.g., approximately 30–50 nanometers or less) is amorphous carbon. It has been discovered that when a layer of amorphous carbon material is patterned to provide a hard mask for features having reduced critical dimensions, shape integrity may be impaired due to the internal properties of the amorphous carbon material. One theory currently being investigated is that internal stresses (e.g., compressive or tensile stresses) in the amorphous carbon material cause the mask to deform. For example, where a layer of amorphous carbon is patterned to form a mask for a conductive line to be formed in a material underlying the mask, a cap layer or anti-reflective coating (ARC) layer may be provided above the amorphous carbon pattern. When this cap or ARC layer is removed, stresses in the amorphous carbon material may cause the mask to buckle or deform to produce a wavy or serpentine pattern. This pattern is then transferred to the conductive line material in a subsequent etching step.

A method for producing portion 10 that reduces or eliminates warpage in the formation of conductive line 30 will now be described with reference to FIGS. 3 to 10. FIG. 11 is a flow diagram that outlines a process 200 used in the formation of portion 10.

Figure 3:
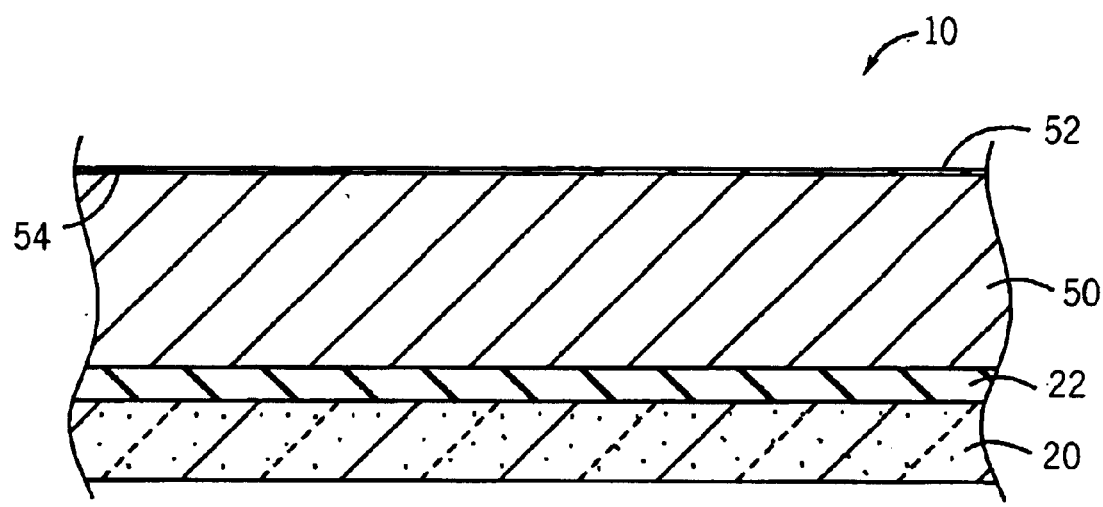
FIG. 3 is a schematic cross-sectional view of the portion shown in FIG. 1 illustrating a polysilicon deposition step.

In a step 210 illustrated in FIG. 3, a layer 50 of conductive or semiconductive material is provided above or over a layer 22 of dielectric material, which is in turn provided above a silicon wafer 20. Layer 50 may be any of a variety of materials suitable for use in a conductive line or gate structure (e.g., metal, polysilicon, polysilicon/germanium ($Si_xGe_{(1-x)}$), etc.) and may be doped or undoped. Layer 22 may be any of a variety of materials suitable for use as a gate dielectric material (e.g., silicon dioxide, silicon nitride, etc.). In an exemplary embodiment, layer 50 is polysilicon deposited by chemical vapor deposition and layer 22 is silicon dioxide thermally grown on silicon substrate 20. In an alternative embodiment, layer 50 may include multiple layers of material, one or more of which may include polysilicon.

In an exemplary embodiment, layer 50 has a thickness of between approximately 1,500 and 2,000 angstroms and layer 22 has a thickness of between approximately 200 and 250 angstroms. In an alternative embodiment, layer 50 has a thickness of between approximately 1,000 and 2,500 angstroms and layer 22 has a thickness of between approximately 20 and 25 angstroms. In an alternative embodiment, layer 22 has a thickness of between approximately 15 and 20 angstroms. Alternatively, layer 22 can be other types of materials used in the formation of narrow lines or structures.

When layer 50 is formed, a thin layer 52 of oxide forms on the top or upper surface 54 of polysilicon layer 50. Oxide layer 52 may be referred to as a "native" oxide layer. The thickness of oxide layer 52 may vary depending on various processing conditions. In an exemplary embodiment, the thickness of oxide layer 52 is between approximately 5 and 20 angstroms.

Figure 4:
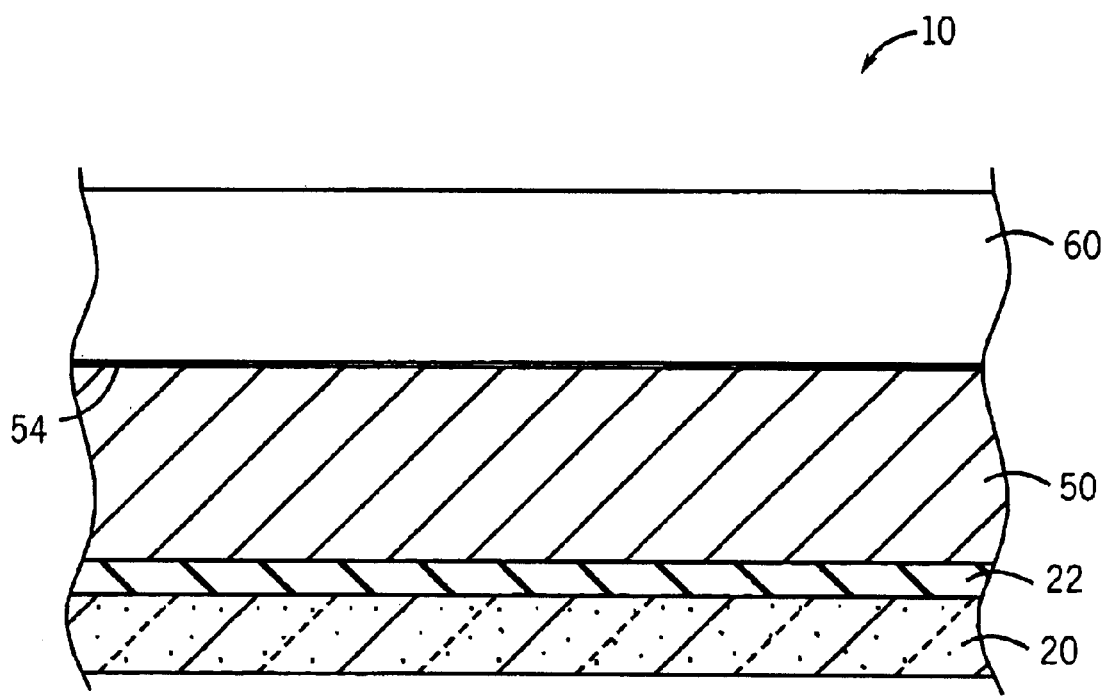
FIG. 4 is a schematic cross-sectional view of the portion shown in FIG. 1 illustrating an amorphous carbon layer deposition step.

In a step 220 shown in FIG. 4, a layer or film 60 of amorphous carbon material is deposited above or over polysilicon layer 50. Layer 60 is deposited in a plasma-enhanced chemical vapor deposition (PECVD) process using a hydrocarbon atmosphere including at least one of methane ($CH_4$), ethane ($C_2H_6$), propylene ($C_3H_6$), and other hydrocarbons. The PECVD process is performed at a temperature of between approximately 400 and 550° C. and a pressure of between approximately 5 and 10 torr with a plasma power of between approximately 800 and 1,500 watts.

In a preferred embodiment, amorphous carbon layer 60 has a thickness of between approximately 250 and 350 angstroms. In alternative embodiments, the thickness of amorphous carbon layer 60 may vary depending on various design considerations. For example, amorphous carbon layer may have a thickness of less than 250 angstroms (e.g., between 100 and 250 angstroms or less). In another alternative embodiment, amorphous carbon layer may have a thickness of greater than 350 angstroms (e.g., between 350 and 700 angstroms or greater).

One advantageous feature of providing an amorphous carbon layer that may be produced with various thicknesses is that the amorphous carbon layer may be produced in a thickness suitable for patterning polysilicon layer 50. For example, where a particular thickness of polysilicon is provided, the thickness of the amorphous carbon layer may be altered so that the proper amount of mask material is provided over the polysilicon material to compensate for the etch selectivities of the materials used. This allows for increased manufacturing efficiency by eliminating unnecessary material use.

In a preferred embodiment, amorphous carbon layer 60 is deposited above polysilicon layer 50 in a pure or undoped form. In an alternative embodiment, the amorphous carbon layer may be deposited with nitrogen incorporated therein.

For example, the amorphous carbon layer as deposited may include between approximately 0 and 10 atomic percent nitrogen. To deposit a nitrogen-containing amorphous carbon layer, a PECVD process using an atmosphere of propylene ($C_3H_6$) and nitrogen is used. To achieve a doping concentration of approximately 6 atomic percent nitrogen, for example, a flow ratio approximately 1:10 is used for the propylene to nitrogen gas flow rate (e.g., 300 cubic centimeters of propylene per minute to 3 liters of nitrogen per minute). In alternative embodiments, various other nitrogen concentrations may be achieved by varying the various processing conditions (e.g., increasing or decreasing the gas flow ratio of propylene to nitrogen, etc.).

In another alternative embodiment, an inert ion species may be implanted or introduced into the amorphous carbon layer. In this embodiment, the inert ions may be implanted at an energy between approximately 5 and 15 keV to a concentration of between approximately 0.1 and 1.0 atomic percent. The implantation of ions into the amorphous carbon layer may be performed in both nitrogen-doped and undoped amorphous carbon layers. Any of a variety of inert ions may be introduced or implanted into the amorphous carbon layer, including helium (He), argon (Ar), neon (Ne), krypton (Kr), xenon (Xe), and radon (Rn). Additionally, more than one inert ion species may be introduced into the amorphous carbon layer. For example, both helium and xenon ions may be implanted into the amorphous carbon layer. Other combinations are also possible in various alternative embodiments.

In yet another alternative embodiment, only a portion of the amorphous carbon layer is doped with nitrogen and/or an inert ion species. For example, a top portion of the amorphous carbon layer may be doped, while a bottom portion of the amorphous carbon layer may comprise pure or undoped amorphous carbon. In another example, the amorphous carbon layer may include alternating layers of doped and undoped amorphous carbon material.

One advantageous feature of doping the amorphous carbon layer with nitrogen and/or inert ions is that the doping may act to relieve or reduce the internal stress of the amorphous carbon layer. For example, where the internal stress of the amorphous carbon layer is generally compressive, the introduction of nitrogen or inert ions into the amorphous carbon layer may reduce the compressive stress or change the internal stress to tensile stress. By altering the stress profile of the amorphous carbon layer, better shape integrity of patterns formed in the amorphous carbon layer, and hence in the underlying material layer, may be obtained. For example, where the amorphous carbon layer is patterned to form a mask for creating a conductive line in an underlying material layer, reduced or altered internal stresses in the amorphous carbon mask may allow the mask to better retain its shape during processing, thus allowing the formation of conductive lines that do not exhibit warpage or wiggle characteristics.

Figure 5:
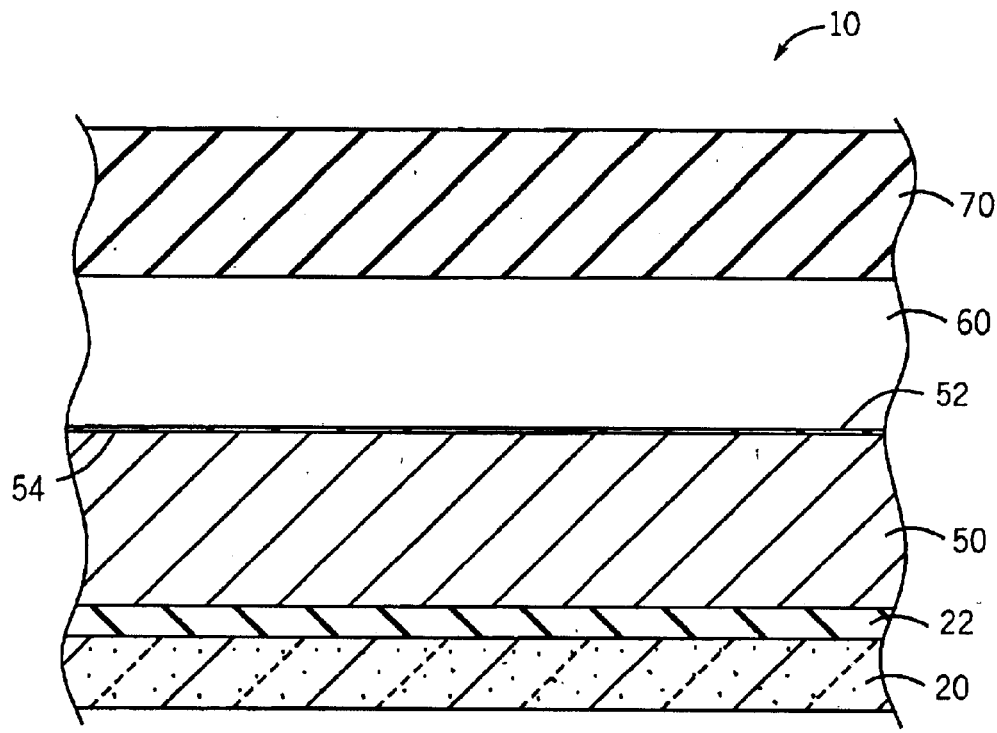
FIG. 5 is a schematic cross-sectional view of the portion shown in FIG. 1 illustrating an anti-reflective coating (ARC) layer deposition step.

To further compensate or manage the internal stress characteristics of amorphous carbon layer 60, a cap layer 70 is provided or deposited above amorphous carbon layer 60 in a step 230 shown in FIG. 5. To facilitate the description below, amorphous carbon layer 60 will be described with reference to the preferred embodiment described above, in which a layer of amorphous carbon is deposited in pure form (i.e., without nitrogen or inert ions being incorporated therein). Amorphous carbon layer 60 can be formed in any of a variety of ways depending on the desired amorphous carbon layer properties, as described above with regard to the various alternative embodiments.

Cap layer 70 may be formed of an anti-reflective material to form an anti-reflective coating (ARC) layer. Cap layer 70 may include silicon nitride (SiN), silicon oxynitride (SiON), silicon-rich oxide (e.g., non-stoichiometric oxide-containing silicon material), silicon-rich nitride, and the like. In an exemplary embodiment, cap layer 70 has a thickness of between approximately 250 and 350 angstroms. One advantageous feature of using a cap layer formed from an anti-reflective material is that the amorphous carbon layer will be protected during deposition and exposure of a photoresist material above amorphous carbon layer 60 and that reflection of ultraviolet (UV) rays used in the exposure of the photoresist will be reduced.

Figure 6:
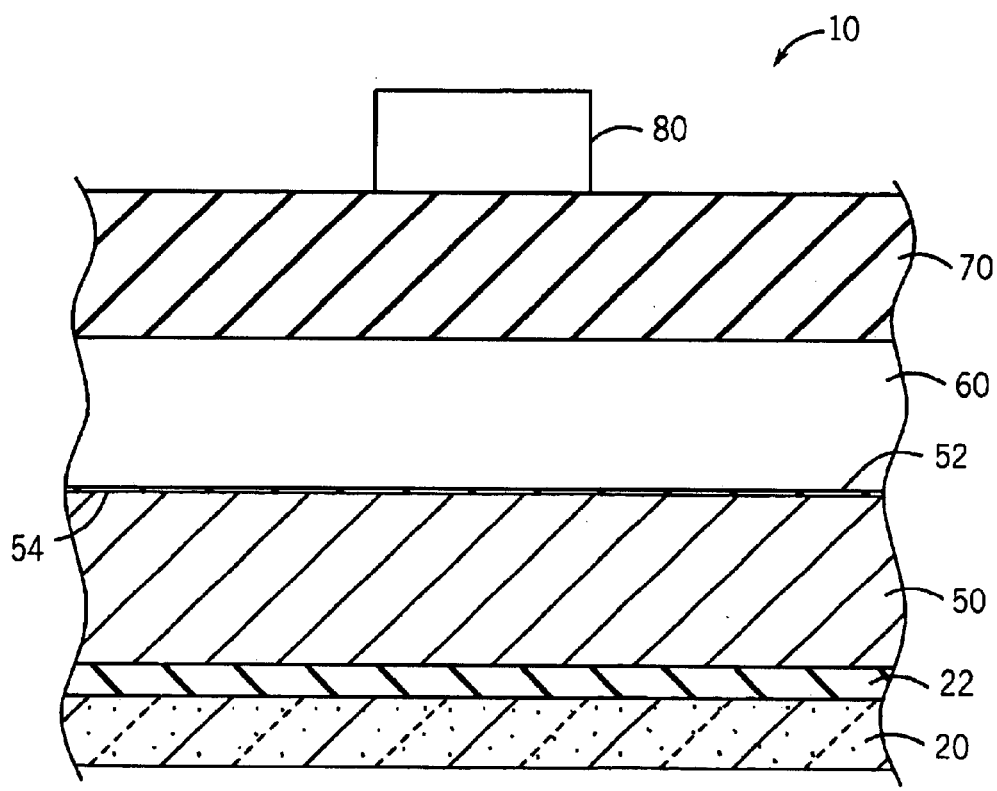
FIG. 6 is a schematic cross-sectional view of the portion shown in FIG. 1 illustrating a mask formation step.

In a step 240 shown in FIG. 6, a layer of photoresist material is deposited above or over cap layer 70 (e.g., by spin-coating) and exposed to form a photoresist feature 80. The layer of photoresist is deposited by spin coating at a thickness of between approximately 2,000 and 4,000 angstroms and is patterned to have a width of between approximately 100 and 150 nanometers. Any of a variety of photoresist materials may be used, including photoresist materials that may be patterned using UV rays having wavelengths of 193 or 248 nanometers.

Figure 7:
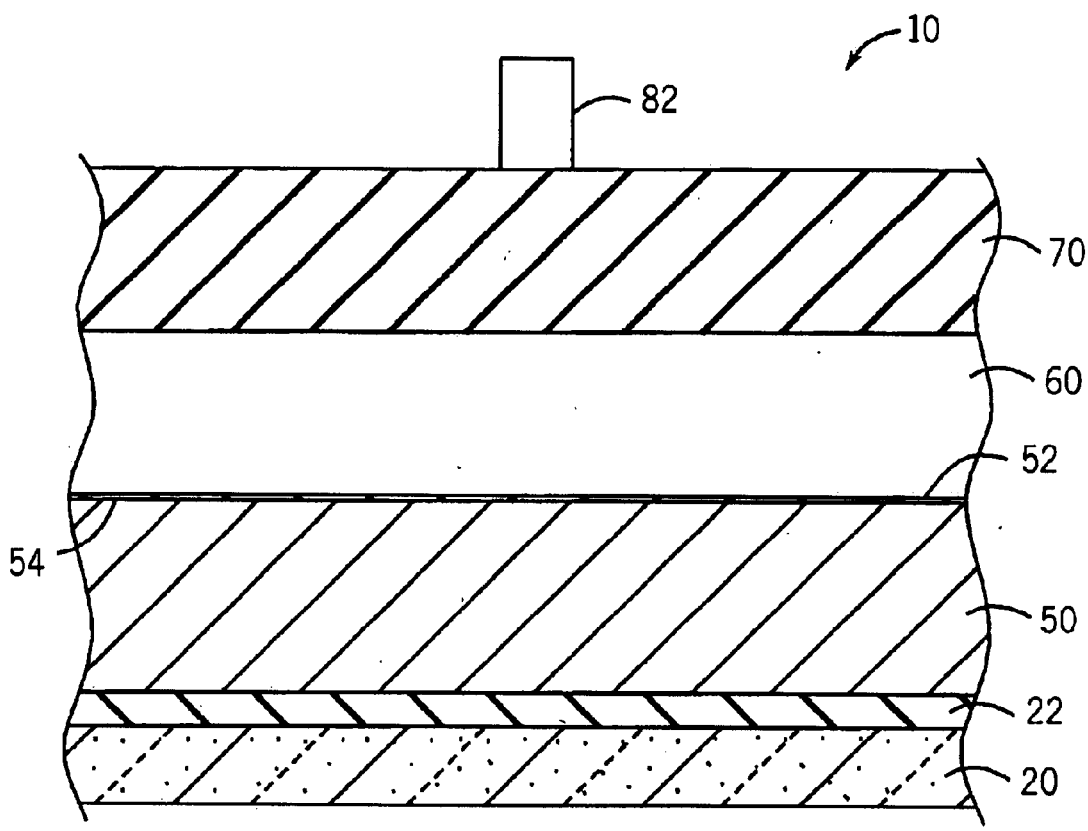
FIG. 7 is a schematic cross-sectional view of the portion shown in FIG. 1 illustrating a mask trimming step.

In a step 250 shown in FIG. 7, photoresist feature 80 is trimmed to form a photoresist mask 82 having reduced dimensions. Trimming is accomplished by oxidizing the photoresist feature and removing the oxidized portion, which results in a photoresist mask having reduced dimensions. The thickness of the photoresist mask formed may depend on the trim rate. For example, in an exemplary embodiment, a trim etching step may erode or remove between approximately 3 to 4 nanometers per second in the vertical direction and between approximately 1.5 and 2.5 nanometers per second in the lateral direction. Other trim rates may be used, and may depend on the type of photoresist material used. Process 200 is particularly advantageous when narrow gate conductors are formed when using trim etching techniques.

In an exemplary embodiment, photoresist mask 82 has a thickness of between approximately 1,000 and 2,500 angstroms and a width of approximately 30 and 50 nanometers after trim etching. In alternative embodiments, photoresist mask may have a thickness of between approximately 2,000 and 3,000 angstroms and a width of approximately 70 and 90 nanometers after trim etching.

Figure 8:
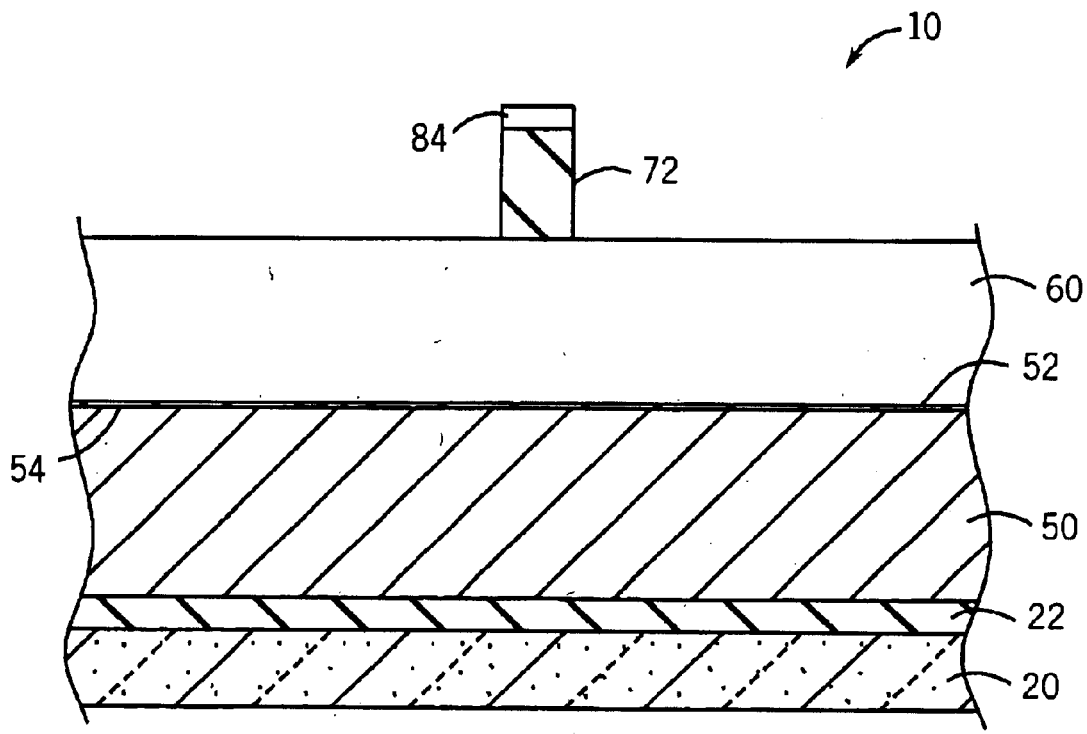
FIG. 8 is a schematic cross-sectional view of the portion shown in FIG. 1 illustrating the formation of an ARC mask for patterning an amorphous carbon layer.

In a step 260 shown in FIG. 8, photoresist mask 82 is used as a mask to pattern cap layer 70 to form a cap feature 72. A small amount of photoresist material 84 remains through the etching and overetching of cap layer 70. In an exemplary embodiment, cap layer 70 is etched using a fluorine-based plasma (e.g., $CF_4$, $CF_4/CHF_3$, etc.). The etching is performed in an argon or helium atmosphere at a temperature of between approximately 30 and 50° C. and a pressure of between approximately 20 and 50 mTorr.

Figure 9:
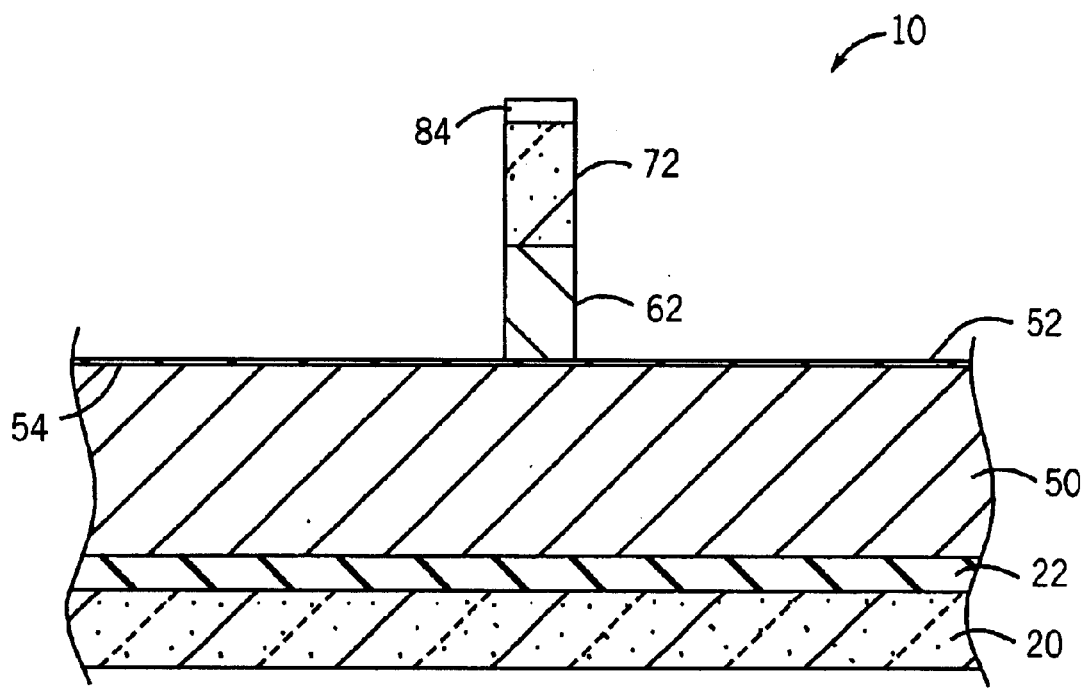
FIG. 9 is a schematic cross-sectional view of the portion shown in FIG. 1 illustrating an amorphous carbon layer patterning step.

In a step 270 shown in FIG. 9, cap feature 72 is used as a mask to pattern amorphous carbon layer 60 to form amorphous carbon feature 62. In an exemplary embodiment, amorphous carbon layer 60 is etched using an oxygen-based plasma at a temperature of between approximately 40° and 60° C. and a pressure of between approximately 3 and 10 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 800 and 1,200 watts and the ion energy control is between approximately 50 and 200 watts.

Using the plasma etch method described above, amorphous carbon feature 62 is formed without the introduction of aqueous etchants, which may damage or destroy feature 62 as processing proceeds. For example, the use of phosphoric acid as an etchant is eliminated by using amorphous carbon, since portions of the amorphous carbon layer may be removed using a plasma etch.

Figure 10:
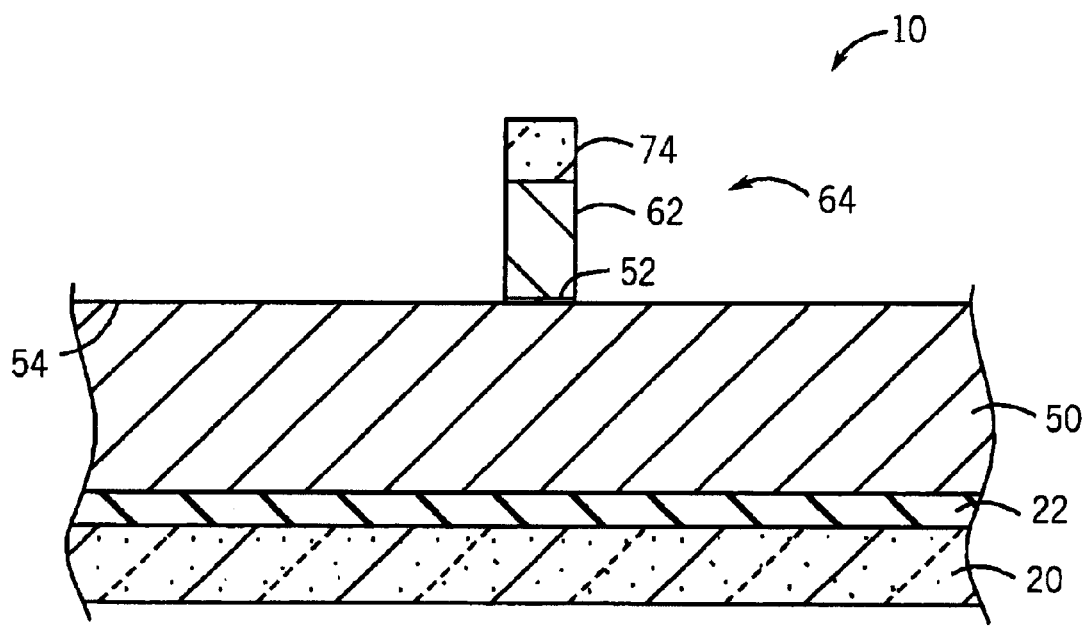
FIG. 10 is a schematic cross-sectional view of the portion shown in FIG. 1 illustrating the formation of an amorphous carbon ARC mask.
Figure 11:
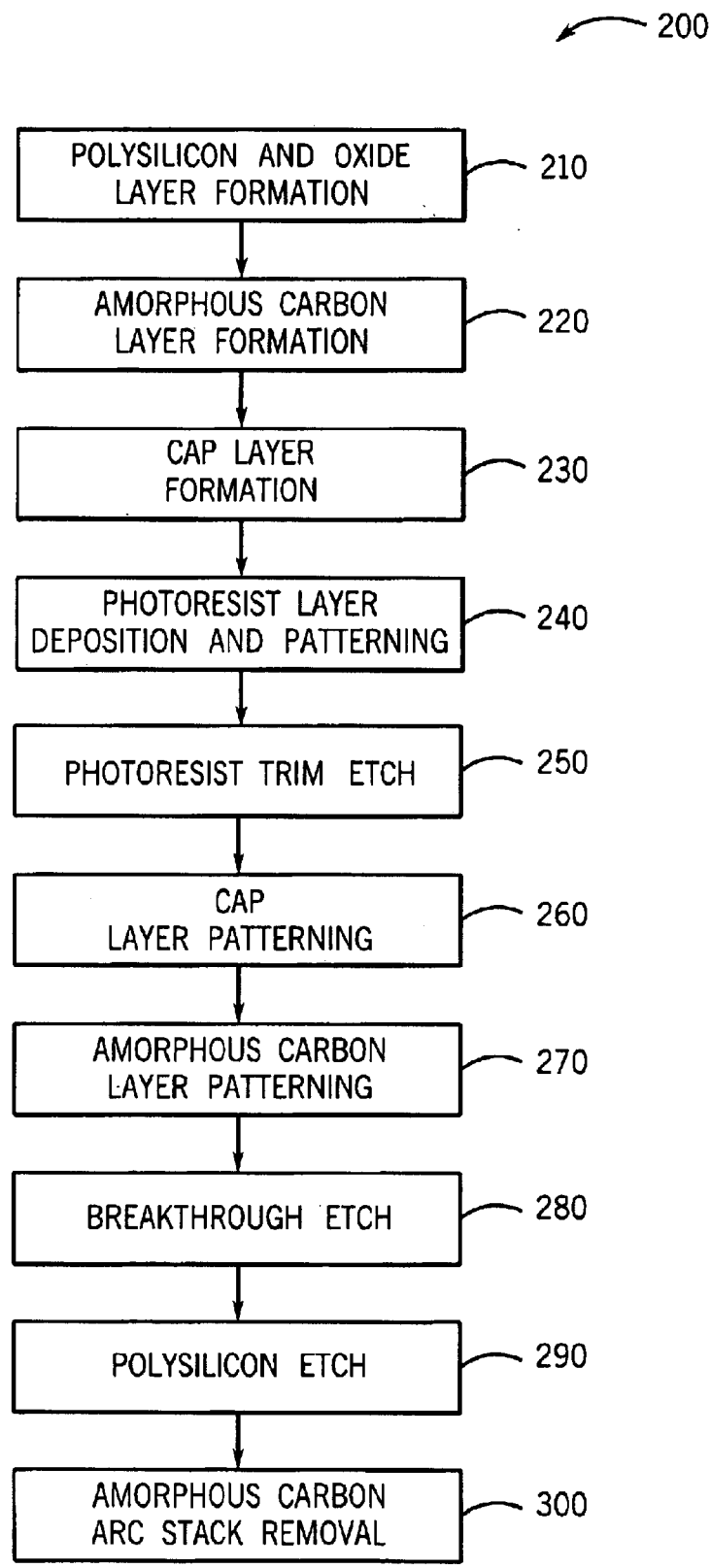
FIG. 11 is a flow diagram illustrating the process of forming structures in an integrated circuit.

In a step 280 shown in FIG. 10, a breakthrough or native oxide removal etch is performed to remove oxide layer 52 from surface 54 of polysilicon layer 50 prior to patterning polysilicon layer 50. The breakthrough etch also removes any remaining photoresist material located on top of cap feature 72. The breakthrough etch step is performed using a plasma etch process. The plasma etch may utilize at least one of $CF_4$ and $CHF_3$ gas in an argon or helium atmosphere at a temperature of between approximately 30 and 50° C. and a pressure of between approximately 20 and 50 mTorr.

During the breakthrough etch, a portion of cap feature 72 is removed to form a reduced or thinned cap feature 74 above amorphous carbon feature 62. In an exemplary embodiment, the thickness of thinned cap feature 74 is between approximately 100 and 150 angstroms. In an alternative embodiment, the thickness of the thinned cap feature may be between 50 and 80 angstroms. The thickness of cap layer 70 may be initially selected to ensure that a portion of cap feature 72 remains after the breakthrough etch is performed.

Together, thinned cap feature 74 and amorphous carbon feature 62 comprise an amorphous carbon ARC stack 64. Thus, a portion or region of amorphous carbon ARC stock comprises amorphous carbon and another portion or region comprises ARC material. One advantageous feature of providing thinned cap feature 74 above amorphous carbon feature 62 is that thinned cap feature 74 may compensate for or otherwise manage the internal stress of amorphous carbon feature 62. Where a thinned cap feature is not provided above an amorphous carbon feature, removal of the overlying cap feature may allow internal stresses in the amorphous carbon feature to take over and deform amorphous carbon feature. In such a situation, line warpage or wiggle may occur. Thinned cap feature 74 acts to constrain deformation of amorphous carbon feature 62 to prevent the occurrence of warpage or wiggle. In this manner, transfer of a warped or wiggling pattern to polysilicon layer 50 during patterning is reduced or eliminated.

In an exemplary embodiment, amorphous carbon ARC mask 64 has a width of between approximately 30 and 60 nanometers. In an alternative embodiment, the amorphous carbon ARC mask may have a width of less than 30 nanometers (e.g., 10–25 nanometers, etc.) or greater than 60 nanometers (e.g., 60–80 nanometers, etc.).

In a step 290, amorphous carbon ARC stack 64 is used to pattern or form features in polysilicon layer 50. For example, polysilicon layer 50 may be etched to form conductive line 30 (shown in FIG. 1). The polysilicon etch is performed using HBr and $Cl_2$ at a temperature of between approximately 40 and 70° C. and a pressure of between approximately 2 and 7 mTorr. In subsequent steps (not shown), additional material layers and features may be formed on or in portion 10.

In a step 300, amorphous carbon ARC stack 64 is removed after polysilicon layer 50 is patterned (e.g., to form conductive line 30 shown in FIG. 1). The constituents of amorphous carbon ARC stack 64 may be removed using methods similar to those described above. For example, the ARC portion of amorphous carbon ARC stack 64 may be removed using a fluorine-based plasma (e.g., $CF_4$, $CF_4/CHF_3$, etc.). The amorphous carbon portion of amorphous carbon ARC stack 64 may be removed using an oxygen-containing plasma to expose the top surface of conductive line 30. In subsequent processing steps, other material layers and devices may be added to portion 10 to form a complete integrated circuit.

While the exemplary embodiments illustrated in the Figures and described above are presently preferred, it should be understood that these embodiments are offered by way of example only. Other embodiments may include, for example, different methods of depositing the various layers above the substrate, different combination of times, temperatures, pressures, and the like. The invention is not limited to a particular embodiment, but extends to various modifications, combinations, and permutations that nevertheless fall within the spirit and scope of the appended claims.

What is claimed is:

1. A method for producing an integrated circuit comprising:
   providing an amorphous carbon layer above a layer of polysilicon material, the layer of polysilicon material including a surface oxide layer;
   providing a layer of anti-reflective coating (ARC) material above the amorphous carbon layer;
   removing a portion of the amorphous carbon layer and the layer of ARC material to form an amorphous carbon ARC stack having an amorphous carbon region and an ARC material region;
   removing the surface oxide layer from a portion of the layer of polysilicon material, wherein at least a portion of the ARC material region remains after removing the surface oxide layer;
   patterning the layer of polysilicon material according to the amorphous carbon ARC stack; and
   removing the amorphous carbon ARC stack.

2. The method of claim 1, wherein the step of removing the surface oxide layer comprises removing a portion of the ARC material region.

3. The method of claim 2, wherein the step of removing the surface oxide layer produces a thinned ARC material region having a thickness of between approximately 100 and 150 angstroms.

4. The method of claim 2, wherein the step of removing the surface oxide layer comprises removing the surface oxide layer from areas not covered by the amorphous carbon ARC stack.

5. The method of claim 1, wherein the amorphous carbon layer and the layer of ARC material each have a deposited thickness of between approximately 250 and 300 angstroms.

6. The method of claim 1, wherein the step of patterning the layer of polysilicon material produces a polysilicon feature having a width of between approximately 30 and 50 nanometers.

7. The method of claim 1, wherein the ARC material is selected from silicon oxynitride, silicon nitride, silicon-rich nitride, and silicon-rich oxide.

8. The method of claim 1, wherein the amorphous carbon layer is doped with at least one of nitrogen, helium, argon, krypton, xenon, radon, and neon.

9. A method for forming features in an integrated circuit, the method comprising:
   depositing a layer of amorphous carbon material above a layer of conductive material;
   depositing a layer of anti-reflective coating (ARC) material over the layer of amorphous carbon material;
   etching the layer of amorphous carbon material and the layer of ARC material to form a mask, the mask comprising an ARC material portion and an amorphous carbon portion; and
   forming a feature in the layer of conductive material by etching the layer of conductive material in accordance with the mask;
   wherein the ARC material portion is thinned prior to the step of forming a feature in the layer of conductive material such that a portion of the ARC material portion remains above the amorphous carbon material during the step of forming a feature in the layer of conductive material.

10. The method of claim 7, wherein the ARC material comprises silicon oxynitride.

11. The method of claim 8, wherein the amorphous carbon layer is doped with at least one of helium, argon, krypton, xenon, radon, and neon.

12. The method of claim 9, wherein the ARC material is selected from silicon oxynitride, silicon-rich nitride, and silicon-rich oxide.

13. The method of claim 9, wherein the layer of conductive material includes a layer of oxide formed thereon and the step of thinning the ARC material portion comprises performing a breakthrough etch to remove the layer of oxide not covered by the mask.

14. The method of claim 9, wherein the thinned ARC material portion has a thickness of between approximately 100 and 150 angstroms and the amorphous carbon portion has a thickness of between approximately 250 and 350 angstroms.

15. The method of claim 9, wherein the layers of amorphous carbon material and ARC material each have a deposited thickness of between approximately 250 and 300 angstroms.

16. The method of claim 9, wherein the feature formed in the layer of conductive material has a width of between approximately 30 and 50 nanometers.

17. The method of claim 9, wherein the ARC material is selected from silicon oxynitride, silicon nitride, silicon-rich nitride, and silicon-rich oxide.

18. The method of claim 9, wherein the conductive material is polysilicon.

19. An integrated circuit formed by a method comprising:
   providing a layer of polysilicon above a semiconductor substrate;
   providing a layer of amorphous carbon above the layer of polysilicon;
   providing a cap layer over the layer of amorphous carbon, the cap layer comprising an anti-reflective coating (ARC) material;
   removing a portion of the cap layer to form a cap feature;
   removing a portion of the amorphous carbon layer to form an amorphous carbon feature beneath the cap feature;
   thinning the cap feature to form a thinned cap layer; and
   etching the layer of polysilicon according to the amorphous carbon feature and the thinned cap feature to form a conductive line.

20. The integrated circuit of claim 19, wherein the layer of amorphous carbon and the cap layer each have a deposited thickness of between approximately 250 and 350 angstroms and the thinned cap feature has a thickness of between approximately 100 and 150 angstroms.

21. The integrated circuit of claim 19, wherein the step of thinning the cap feature comprises removing a portion of a layer of oxide formed over the layer of polysilicon that is not covered by the amorphous carbon feature and the cap feature.

22. The integrated circuit of claim 19, wherein the step of removing a portion of the layer of amorphous carbon comprises etching the layer of amorphous carbon using an oxygen-based plasma.

* * * * *